United States Patent
Zhang et al.

(10) Patent No.: US 8,184,411 B2
(45) Date of Patent: May 22, 2012

(54) MTJ INCORPORATING COFE/NI MULTILAYER FILM WITH PERPENDICULAR MAGNETIC ANISOTROPY FOR MRAM APPLICATION

(75) Inventors: Kunliang Zhang, Fremont, CA (US); Min Li, Dublin, CA (US); Pokang Wang, Los Altos, CA (US); Yuchen Zhou, San Jose, CA (US); Cheng T. Horng, San Jose, CA (US); Ru-Ying Tong, Los Gatos, CA (US)

(73) Assignees: Headway Technologies, Inc., Milpitas, CA (US); MagIC Technologies, Inc., Milpitas, CA (US)

( * ) Notice: Subject to any disclaimer, the term of this patent is extended or adjusted under 35 U.S.C. 154(b) by 344 days.

(21) Appl. No.: 12/589,614

(22) Filed: Oct. 26, 2009

(65) Prior Publication Data

US 2011/0096443 A1    Apr. 28, 2011

(51) Int. Cl.
*G11B 5/33* (2006.01)

(52) U.S. Cl. .................................................. 360/324.2

(58) Field of Classification Search ................. 360/128, 360/122, 313, 324.12, 125.03, 234.3
See application file for complete search history.

(56) References Cited

U.S. PATENT DOCUMENTS

| | | | |
|---|---|---|---|
| 5,549,978 A | 8/1996 | Iwasaki et al. | |
| 6,911,256 B2 | 6/2005 | Sexton | |
| 7,105,240 B2 | 9/2006 | Wu et al. | |
| 7,128,987 B2 | 10/2006 | van de Veerdonk et al. | |
| 7,134,185 B1 | 11/2006 | Knapp et al. | |
| 7,169,488 B2 | 1/2007 | Chen et al. | |
| 7,175,925 B2 | 2/2007 | Chen et al. | |
| 7,433,161 B2 | 10/2008 | Ikarashi et al. | |
| 7,494,726 B2 | 2/2009 | Watanabe et al. | |
| 7,495,434 B2 | 2/2009 | Zimmer et al. | |
| 7,562,436 B2 | 7/2009 | Jayasekara | |
| 7,583,481 B2* | 9/2009 | Zhang et al. | 360/324.11 |
| 7,672,088 B2* | 3/2010 | Zhang et al. | 360/324.11 |
| 8,012,316 B2* | 9/2011 | Zhang et al. | 204/192.25 |
| 2006/0098354 A1 | 5/2006 | Parkin | |
| 2007/0111332 A1 | 5/2007 | Zhao et al. | |
| 2007/0148786 A1 | 6/2007 | Horng et al. | |
| 2007/0278602 A1 | 12/2007 | Raberg et al. | |

(Continued)

OTHER PUBLICATIONS

International Search Report PCT/US 10/02838 mail date—Dec. 23, 2010, Headway Technologies.

(Continued)

*Primary Examiner* — Allen Cao
(74) *Attorney, Agent, or Firm* — Saile Ackerman LLC; Stephen B. Ackerman

(57) ABSTRACT

A MTJ for a spintronic device is disclosed and includes a thin composite seed layer made of at least Ta and a metal layer having fcc(111) or hcp(001) texture as in Ta/Ti/Cu to enhance perpendicular magnetic anisotropy (PMA) in an overlying laminated layer with a $(CoFe/Ni)_x$, $(Co/NiFe)_x$, $(Co/NiCo)_x$, $(CoFe/NiFe)_x$, or $(CoFe/NiCo)_x$ composition where x is from 5 to 30. In one embodiment, a CPP-TMR spin valve has one or both of a laminated free layer and laminated reference layer with the aforementioned compositions. The MTJ includes an interfacial layer made of CoFeB, CoFeB/CoFe, or CoFe/CoFeB between each laminated structure and the tunnel barrier. The laminated layers are deposited by a low power and high Ar pressure process to avoid damaging interfaces between adjoining layers. Annealing occurs at 220° C. to 400° C. A laminated layer with high PMA may also be included in one or more layers of a spin transfer oscillator.

29 Claims, 7 Drawing Sheets

U.S. PATENT DOCUMENTS

| | | | |
|---|---|---|---|
| 2008/0008909 | A1 | 1/2008 | Fuji et al. |
| 2008/0070063 | A1 | 3/2008 | Ibusuki et al. |
| 2008/0117552 | A1 | 5/2008 | Zhou et al. |
| 2008/0170329 | A1 | 7/2008 | Thangaraj et al. |
| 2008/0273380 | A1 | 11/2008 | Diao et al. |
| 2009/0166322 | A1 | 7/2009 | Ikegawa et al. |
| 2009/0201614 | A1 | 8/2009 | Kudo et al. |
| 2009/0246557 | A1 | 10/2009 | Horng et al. |
| 2009/0257151 | A1 | 10/2009 | Zhang et al. |
| 2009/0314632 | A1* | 12/2009 | Zhang et al. ............ 204/192.2 |
| 2011/0183158 | A1* | 7/2011 | Zhang et al. ............ 428/811.1 |

OTHER PUBLICATIONS

"Co/Ni Multilayers with Perpendicular Magnetic Anisotropy: Kerr Effect and Thermomagnetic Writing," by F. J. A. den Broeder et al., Applied Physics Letters, vol. 61, No. 12, Sep. 21, 1992, pp. 1468-1470, 1992 American Institute of Physics.

"Spin-Torque Driven Ferromagnetic Resonance of Co/Ni Synthetic Layers in Spin Vavles," by W. Chen et al., Applied Physics Letters 92, 012507, 2008 American Institute of Physics, pp. 1-3.

"Effect of [111] Texture on the Perpendicular Magnetic Anisotropy of Co/Ni Multilayers,"by V. M. Naik et al., Journal of Applied Physics, vol. 84, No. 6, Sep. 15, 1998, pp. 3273-3277, 1998 American Institute of Physics.

"Magnetic and Magneto-Optic Properties of Sputtered Co/Ni Multilayers," by Y. B. Zhang et al., Journal of Applied Physics, vol. 75, No. 10, May 15, 1994, pp. 6495-6497, 1994 American Institute of Physics.

"Perpendicular magnetic anisotropy of the epitaxial fcc Co/60-A-Ni/Cu(001) system," by Jaeyong Lee et al., Physical Review B, vol. 56, No. 10, Sep. 1, 1997-II, pp. R5728-r5731, 1997 The American Physical Society.

"Magnetic anisotropies in Co/Ni(111) multilayers," by P J. H. Bloemen et al., Journal of Applied Physics, vol. 72, No. 10, Nov. 15, 1992, 1992 American Institute of Physics, pp. 4840-4844.

"Prediction and Confirmation of Perpendicular Magnetic Anisotropy in Co/Ni Multilayers," by G. H. O. Daalderop et al., Physical Review Letters, vol. 68, No. 5, Feb. 3, 1992, pp. 682-685.

"Current-driven excitation of magnetic multilayers," by J. C. Slonczewski, Journal of Magnetism and Magnetic Materials 159 (1996) L1-L7, Elsevier.

"Spin transfer switching in TbCoFe/CoFeB/MgO/CoFeB/TbCoFe magnetic tunnel junctions with perpendicular magnetic anisotropy," by Masahiko Nakayama et al., Journal of Applied Physics, 103, 07A710 (2008), 2008 American Institute of Physics, pp. 1-3.

"Reducing the critical current for spin-transfer switching of perpendicularly magnetized nanomagnets," by S. Mangin et al., Applied Physics Letters 94, 012502 (2009), 2009 American Institute of Physics, pp. 1-3.

"Low critical current for spin transfer in magnetic tunnel junctions," by Hao Meng et al., Applied Physics Letters 88, 082504 (2006), 2006 American Institute of Physics, pp. 1-3.

"Spin-polarized current-induced magnetization reversal in perpendicularly magnetized L1o-FePt layers," by T. Seki et al., Applied Physics Letters 88, 172504 (2006), 2006 American Institute of Physics, pp. 1-3.

"Temperature Dependence of Current-Induced Magnetization Switching in Spin Valves with a Ferrimagnetic CoGd Free Layer," by Xin Jiang et al., Physical Review Letters, PRL 97, 217202 (2006), week ending Nov. 24, 2006, 2006 The American Physical Society, pp. 1-4.

"Microwave Assisted Magnetic Recording," by Jian-Gang Zhu et al., IEEE Transactions on Magnetics, vol. 44, No. 1, Jan. 2008, pp. 125-131.

"Current-induced magnetization reversal in nanopillars with perpendicular anisotropy," by S. Mangin et al., 2006 Nature Publishing Group, pp. 210-215, nature materials/VOL5/MARCH 2006/www.nature.com/naturematerials.

* cited by examiner

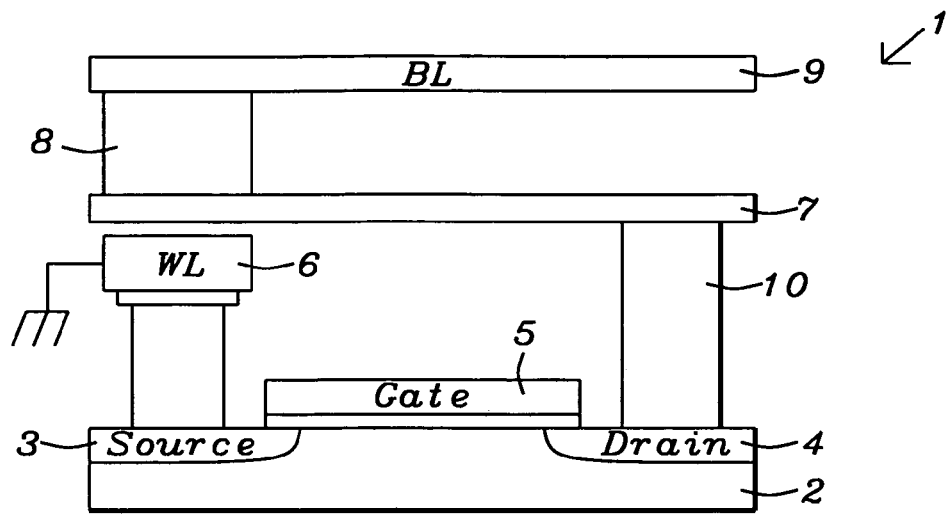
FIG. 1a – Prior Art
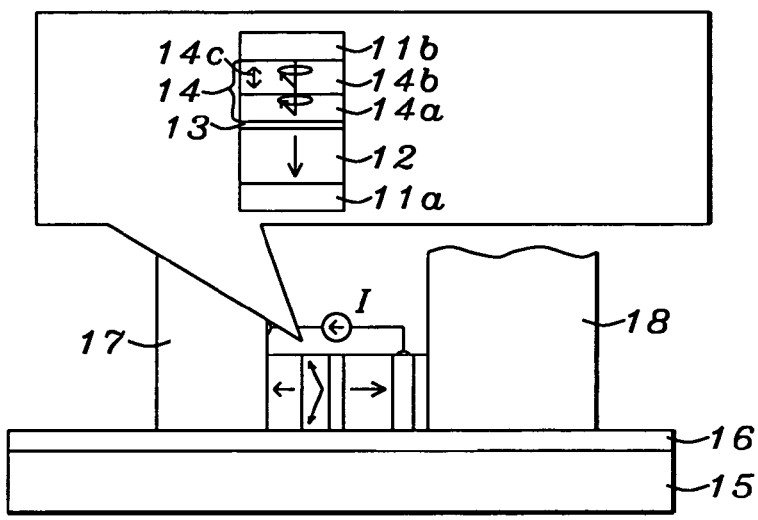
FIG. 1b – Prior Art
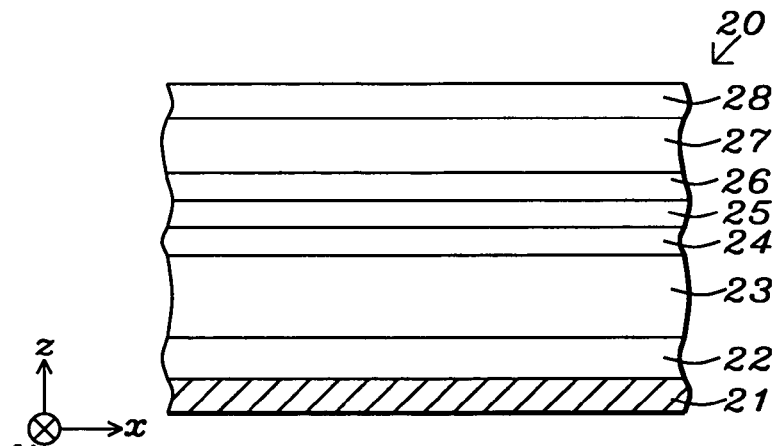
FIG. 2

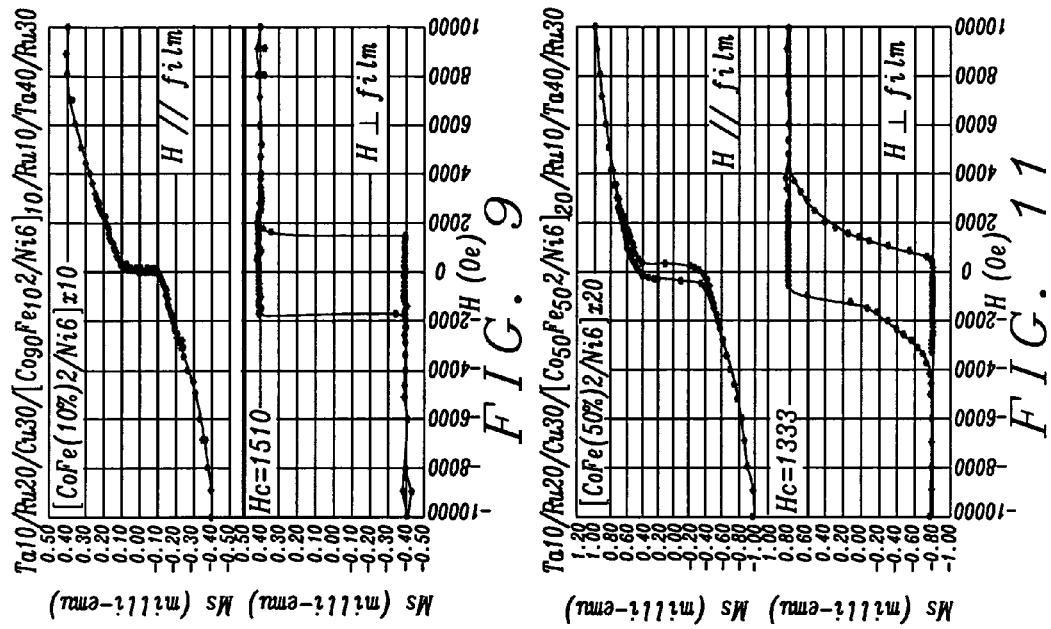
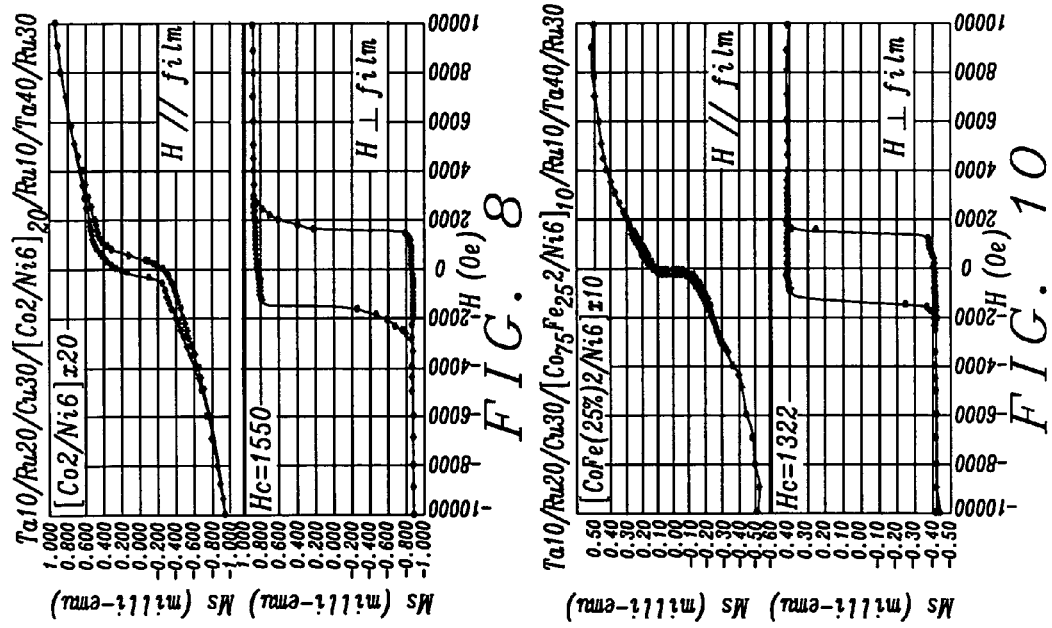

MTJ INCORPORATING COFE/NI MULTILAYER FILM WITH PERPENDICULAR MAGNETIC ANISOTROPY FOR MRAM APPLICATION

RELATED PATENT APPLICATION

This application is related to the following: Ser. No. 12/456,621, filing date Jun. 19, 2009; herein incorporated by reference in its entirety.

FIELD OF THE INVENTION

The invention relates to a high performance spin valve such as a CPP-GMR (current perpendicular to plane-giant magnetoresistance) element or a tunneling magnetoresistive (TMR) element and a method for making the same, and in particular, to a spintronic device that includes a magnetic tunnel junction (MTJ) having one or both of a laminated reference layer and laminated free layer with high perpendicular magnetic anisotropy (PMA).

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, and Flash. Similarly, spin-transfer (spin torque or STT) magnetization switching described by C. Slonczewski in "Current driven excitation of magnetic multilayers", J. Magn. Magn. Mater. V 159, L1-L7 (1996), has recently stimulated considerable interest due to its potential application for spintronic devices such as STT-MRAM on a gigabit scale. Recently, J-G. Zhu et al. described another spintronic device called a spin transfer oscillator in "Microwave Assisted Magnetic Recording", IEEE Trans. on Magnetics, Vol. 44, No. 1, pp. 125-131 (2008) where a spin transfer momentum effect is relied upon to enable recording at a head field significantly below the medium coercivity in a perpendicular recording geometry.

Both MRAM and STT-MRAM may have a MTJ element based on a tunneling magneto-resistance (TMR) effect wherein a stack of layers has a configuration in which two ferromagnetic layers are separated by a thin non-magnetic dielectric layer. In another aspect, the MTJ may be based on a GMR effect where a reference layer and free layer are separated by a metal spacer. The MTJ element is typically formed between a bottom electrode such as a first conductive line and a top electrode which is a second conductive line at locations where the top electrode crosses over the bottom electrode. A MTJ stack of layers may have a bottom spin valve configuration in which a seed layer, an anti-ferromagnetic (AFM) pinning layer, a ferromagnetic "pinned" layer, a thin tunnel barrier layer, a ferromagnetic "free" layer, and a capping layer are sequentially formed on a bottom electrode. The AFM layer holds the magnetic moment of the pinned layer in a fixed direction. The pinned or reference layer has a magnetic moment that is fixed in the "y" direction, for example, by exchange coupling with the adjacent AFM layer that is also magnetized in the "y" direction. The free layer has a magnetic moment that is either parallel or anti-parallel to the magnetic moment in the pinned layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current is passed from the top electrode to the bottom electrode in a direction perpendicular to the MTJ layers, a lower resistance is detected when the magnetization directions of the free and pinned layers are in a parallel state ("0" memory state) and a higher resistance is noted when they are in an anti-parallel state or "1" memory state.

In a read operation, the information stored in a MRAM cell is read by sensing the magnetic state (resistance level) of the MTJ element through a sense current flowing top to bottom through the cell in a current perpendicular to plane (CPP) configuration. During a write operation, information is written to the MRAM cell by changing the magnetic state in the free layer to an appropriate one by generating external magnetic fields as a result of applying bit line and word line currents in two crossing conductive lines, either above or below the MTJ element. One line (bit line) provides the field parallel to the easy axis of the bit while another line (digit line) provides the perpendicular (hard axis) component of the field. The intersection of the lines generates a peak field that is engineered to be just over the switching threshold of the MTJ.

A high performance MRAM MTJ element is characterized by a high tunneling magnetoresistive (TMR) ratio which is dR/R where R is the minimum resistance of the MTJ element and dR is the change in resistance observed by changing the magnetic state of the free layer. A high TMR ratio and resistance uniformity (Rp_cov), and a low switching field (Hc) and low magnetostriction ($\lambda_s$) value are desirable for conventional MRAM applications. For Spin-MRAM (STT-MRAM), a high $\lambda_s$ and high Hc leads to high anisotropy for greater thermal stability. RA should be relatively small (about 4000 ohm-$\mu m^2$ or less) for MTJs that have an area defined by an easy axis and hard axis dimensions of less than 1 micron.

As the size of MRAM cells decreases, the use of external magnetic fields generated by current carrying lines to switch the magnetic moment direction becomes problematic. One of the keys to manufacturability of ultra-high density MRAMs is to provide a robust magnetic switching margin by eliminating the half-select disturb issue. For this reason, a new type of device called a spin transfer (spin torque) device was developed. Compared with conventional MRAM, spin-transfer torque or STT-MRAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current transverses a magnetic multilayer in a CPP configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small. The difference between a STT-MRAM and a conventional MRAM is only in the write operation mechanism. The read mechanism is the same.

Referring to FIG. 1a, a conventional STT-MRAM structure 1 is shown and includes a gate 5 formed above a p-type semiconductor substrate 2, a source 3, drain 4, word line (WL) 6, bottom electrode (BE) 7, and bit line (BL) 9. There is also a MTJ element 8 formed between the bit line 9 and bottom electrode 7, and a via 10 for connecting the BE to the drain 4.

Materials with PMA are of particular importance for magnetic and magnetic-optic recording applications. Spintronic devices with perpendicular magnetic anisotropy have an advantage over MRAM devices based on in-plane anisotropy in that they can satisfy the thermal stability requirement and have a low switching current density but also have no limit of cell aspect ratio. As a result, spin valve structures based on PMA are capable of scaling for higher packing density which is one of the key challenges for future MRAM applications and other spintronic devices. Theoretical expressions predict that perpendicular magnetic devices have the potential to achieve a switching current lower than that of in-plane magnetic devices with the same magnetic anisotropy field according to S. Mangin et al. in Nat. Mater. 5, 210 (2006).

When the size of a memory cell is reduced, much larger magnetic anisotropy is required because the thermal stability factor is proportional to the volume of the memory cell. Generally, PMA materials have magnetic anisotropy larger than that of conventional in-plane soft magnetic materials such as NiFe or CoFeB. Thus, magnetic devices with PMA are advantageous for achieving a low switching current and high thermal stability. Several groups have studied spin transfer switching in GMR multilayers with perpendicular magnetic anisotropy and reported their results including the aforementioned S. Mangin publication as well as H. Meng et al. in "Low critical current for spin transfer in magnetic tunnel junctions", J. Appl. Phys. 99, 08G519 (2006), X. Jiang et al. in "Temperature dependence of current-induced magnetization switching in spin valves with a ferromagnetic CoGd free layer", Phys. Rev. Lett. 97, 217202 (2006), T. Seki et al. in "Spin-polarized current-induced magnetization reversal in perpendicularly magnetized $L1_0$-FePt layers", Appl. Phys. Lett. 88, 172504 (2006), and S. Mangin et al. in "Reducing the critical current for spin-transfer switching of perpendicularly magnetized nanomagnets", Appl. Phys. Lett. 94, 012502 (2009). However, in the GMR devices described in the prior art, typical switching current density is above 10 milli-amp/$cm^2$ which is too high for low switching current MRAM. Furthermore, the MR ratio is around 1% which is too small for the readout signal in MRAM. Therefore, improving the spin transfer switching performance in MTJ elements with PMA is extremely important for high performance MRAM applications.

There is a report by M. Nakayama et al. in "Spin transfer switching in TbCoFe/CoFeB/MgO/CoFeB/TbCoFe magnetic tunnel junctions with perpendicular magnetic anisotropy", J. Appl. Phys. 103, 07A710 (2008) on spin transfer switching in a MTJ employing a TbCoFe PMA structure. However, in a MTJ with a TbCoFe or FePt PMA layer, strenuous annealing conditions are usually required to achieve an acceptably high PMA value. Unfortunately, high temperatures are not so practical for device integration.

PMA materials have been considered for microwave assisted magnetic recording (MAMR) as described by J-G. Zhu et al. in "Microwave Assisted Magnetic Recording", IEEE Trans. on Magn., Vol. 44, No. 1, pp. 125-131 (2008). A mechanism is proposed for recording at a head field significantly below the medium coercivity in a perpendicular recording geometry. FIG. 1b is taken from the aforementioned reference and shows an ac field assisted perpendicular head design. The upper caption 19 represents a perpendicular spin torque driven oscillator for generating a localized ac field in a microwave frequency regime and includes a bottom electrode 11a, top electrode 11b, perpendicular magnetized reference layer 12 (spin injection layer), metallic spacer 13, and oscillating stack 14. Oscillator stack 14 is made of a field generation layer 14a and a layer with perpendicular anisotropy 14b having an easy axis 14c. The ac field generator in the upper caption 19 is rotated 90 degrees with respect to the lower part of the drawing where the device is positioned between a write pole 17 and a trailing shield 18. The writer moves across the surface of a magnetic media 16 that has a soft underlayer 15. The reference layer 12 provides for spin polarization of injected current (I). Layers 14a, 14b are ferromagnetically exchanged coupled. Improved materials for the reference layer and oscillator stack are needed as this technology matures.

In other prior art references, U.S. Pat. No. 7,495,434 discloses a Ta and/or Ru seed layer and a sensor layer made of CoFeNi. U.S. Patent Application 2007/0278602, U.S. Patent Application 2008/0273380, and U.S. Patent Application 2009/0166322 describe a CoFeNi reference or free layer. U.S. Patent Application 2008/0070063 discloses a Ru—Rh seed layer and a reference layer comprising at least one of Fe, Ni, and Co.

Ta and Ti have been employed as a buffer layer or stress reduction layer in magnetic media as described in U.S. Pat. No. 6,911,256. U.S. Pat. No. 7,494,726 discloses a magnetic recording layer comprised of CoFeNi with a seed layer of Ni based alloy and Ti and Ta. However, none of the aforementioned references discuss a laminated free layer or reference layer with perpendicular magnetic anisotropy.

SUMMARY OF THE INVENTION

One objective of the present invention is to provide one or more MTJ layers with high perpendicular magnetic anisotropy, high Mst (magnetic saturation x thickness), and high spin polarization for advanced MRAM structures including spintronic and MAMR devices, and a thin seed layer for enhancing the PMA in the aforementioned layers.

A second objective of the present invention is to provide a MTJ incorporating one or more layers with high PMA and a thin seed layer according to the first objective that also has improved thermal stability for high density MRAM.

According to one embodiment, these objectives are achieved in a MTJ with a bottom spin valve configuration for a MRAM application. The MTJ is comprised of a stack of layers including a composite seed layer, a $[Co_{(100-z)}Fe_z(t1)/Ni(t2)]_x$ laminated reference layer where z is from 0 to 90 and x is from 5 to 30, a first CoFeB/CoFe or CoFeB interfacial layer, a MgO tunnel barrier, a second CoFeB or CoFe/CoFeB interfacial layer, a $[Co_{(100-z)}Fe_z(t1)/Ni(t2)]_y$ laminated free layer where y is 3 to 10, and a capping layer sequentially formed on a substrate. Thickness t2 for each of the Ni layers is preferably greater than the thickness t1 for each of the CoFe layers in the laminated layers. The seed layer preferably has a Ta/M1/M2 or Ta/M1 configuration where M1 is a metal having a fcc(111) or (hcp) hexagonal closed packed (001) crystal orientation such as Ru, Ti, Zr, Hf, NiCr, NiFeCr or the like, and M2 is Cu, Ti, Pd, W, Rh, Au, or Ag. The Ta and M1 layers in the composite seed layer are critical for enhancing the (111) texture in overlying layers. Alternatively, the laminated reference layer may have a composition represented by [Co(t1)/NiFe(t2)]$_x$, [Co(t1)/NiCo(t2)]$_x$, [CoFe(t1)/NiFe(t2)]$_x$, or [CoFe(t1)/NiCo(t2)]$_x$ and the laminated free layer may have a [Co(t1)/NiFe(t2)]$_y$, [Co(t1)/NiCo(t2)]$_y$, [CoFe(t1)/NiFe(t2)]$_y$, or [CoFe(t1)/NiCo(t2)]$_y$ composition. The first interfacial layer serves to promote MgO growth for higher spin polarization and the second interfacial layer also enhances spin polarization in the overlying free layer. The capping layer may be Ru/Ta/Ru, for example. Furthermore, CoFe in the laminated layers may be replaced by a CoFe alloy such as CoFeR where R is one of Ru, Rh, Pd, Ni, Ti, Zr, Hf, Cr, Mg, Mn, or Cu.

In a second embodiment, the bottom spin valve in the first embodiment is modified to include an anti-ferromagnetic (AFM) layer between the seed layer and laminated reference layer. The AFM layer acts as a pinning layer for the laminated reference layer and also as a spin depolarization layer for reference layer stabilization. No degradation in PMA is found with AFM insertion into the MTJ stack.

In a third embodiment, the MgO tunnel barrier in the first embodiment may be replaced by a non-magnetic spacer layer such as Cu to give a CPP-GMR spin valve structure. Furthermore, the non-magnetic spacer may comprise a confining current path (CCP) layer between upper and lower portions of a non-magnetic spacer layer.

In a fourth embodiment relating to a MAMR structure, a stack of layers comprised of a composite seed layer, reference layer with PMA, non-magnetic metal spacer, field generation layer, and PMA layer is sequentially formed between two electrodes. Each of the planes of the layers is oriented perpendicular to an ABS and between a write pole and a trailing shield in a PMR write head. The composite seed layer, laminated $(CoFe/Ni)_x$ reference layer, and non-magnetic metal spacer may be made of the same materials as in the third embodiment. The field generation layer may be CoFe or an alloy thereof. The PMA layer is ferromagnetically coupled with the field generation layer to form an oscillating stack in the MAMR configuration and may be comprised of a laminated layer with a composition as disclosed in the first embodiment.

In the first three embodiments, once all the layers in the stack are laid down, a patterning and etching sequence is followed to fabricate a spin valve structure that may be in the shape of an oval, circle, or polygon from a top-down view.

An important feature of all embodiments is that each of the layers in the CoFe/Ni, CoFeR/Ni, Co/NiFe, Co/NiCo, CoFe/NiFe, and CoFe/NiCo laminated structures is deposited with a very low RF power and a high inert gas pressure to minimize the impinging ion energy so that deposition of a layer does not damage a previously deposited layer. Thus, the interfaces between adjoining layers are preserved to maximize the PMA property. Furthermore, this method enables the PMA of the laminated structures to be preserved with a substantially thinner seed layer.

BRIEF DESCRIPTION OF THE DRAWINGS

FIG. 1a is a cross-sectional view showing a memory cell in a conventional STT-MRAM device.

FIG. 1b is a schematic illustration of a MAMR recording head with an ac field assisted perpendicular head design according to a prior art reference.

FIG. 2 is cross-sectional view of a CPP-TMR bottom spin valve structure in a MRAM according to a first embodiment of the present invention.

FIG. 8 shows MH curves for a stack of layers comprising a $(Co2/Ni6)_{20}$ laminate.

FIG. 9 depicts MH curves for a $(Co_{90}Fe_{10}2/Ni6)_{10}$ laminated free layer or reference layer with PMA according to an embodiment of the present invention.

FIG. 10 depicts MH curves for a $(Co_{75}Fe_{25}2/Ni6)_{10}$ laminated free layer or reference layer with PMA according to an embodiment of the present invention.

FIG. 11 shows MH curves for a $(Co_{50}Fe_{50}2/Ni6)_{20}$ laminated free layer or reference layer with PMA according to an embodiment of the present invention.

DETAILED DESCRIPTION OF THE INVENTION

Figure 3:
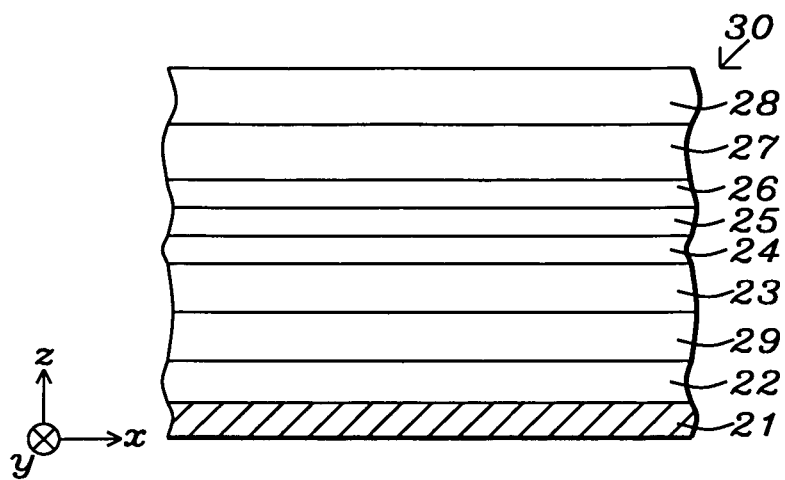
FIG. 3 is a cross-sectional view of a CPP-TMR bottom spin valve structure comprising an AFM layer according to a second embodiment of the present invention.

The present invention is a CPP spin valve structure that includes one or both of a laminated reference layer and a laminated free layer with high perpendicular magnetic anisotropy (PMA). PMA is fully established in the laminated reference layer with a thin composite seed layer comprised of a lower Ta layer and an upper metal layer with fcc(111) or hcp(001) crystal orientation for enhanced performance in spin transfer oscillators including MAMR devices, STT-MRAM devices, and in other spintronic devices. The present invention also includes a method of depositing the laminated layers such that the interfaces between the laminated layers are well preserved and only a thin seed layer is required for establishing the desired fcc (111) orientation in the reference layer. Although the exemplary embodiments depict a bottom spin valve, those skilled in the art will appreciate that the laminated reference layer and laminated free layer may also be incorporated in a top spin valve or dual spin valve configuration.

In related patent application Ser. No. 12/456,621, we disclosed the advantages of Co/Ni multilayer structures having PMA in MRAM applications where the magnetic anisotropy of a $(Co/Ni)_x$ laminated structure arises from the spin-orbit interactions of the 3d and 4s electrons of Co and Ni atoms. Such interaction causes the existence of an orbital moment which is anisotropic with respect to the crystal axes which are in (111) alignment, and also leads to an alignment of the spin moment with the orbital moment. Since Fe, Co, and Ni atoms have very similar outer electron configurations, i.e. Fe has $[Ar]3d^64s^2$ which is one electron different from Co $[Ar]3d^74s^2$ which has one electron less than Ni $[Ar]3d^84s^2$, in principle, with some thickness and process optimizations, there should be a possibility of PMA behavior in CoFe/Ni laminated structures. As a result of our investigation, we discovered substantial PMA behavior in CoFe/Ni laminates which to our knowledge has not been reported in the literature. In a later section, a method is described for depositing CoFe and Ni layers such that the interfaces are preserved between the laminated CoFe and Ni layers thereby establishing high PMA without the need for a thick seed layer. It is believed that once the number of laminations "x" or "y" in the (CoFe/Ni)$_x$ and (CoFe/Ni)$_Y$ structures disclosed herein reaches a large enough number between about 5 and 30 for "x" (and from 3 to 10 for "y" in a laminated free layer), there is a sufficient quantity of CoFe and Ni valence electrons to generate a high PMA for spintronics applications from the spin-orbit interactions.

First, various embodiments of a spin valve structure according to the present invention will be described and then a method for forming a laminated structure which preserves the interfaces between laminated layers will be provided.

Referring to FIG. 2, a cross-sectional view of a bottom spin valve structure, MTJ 20, is depicted according to one embodiment of the present invention. In this case, the spin valve structure 20 has a CPP-TMR configuration. A substrate 21 is shown that may be a bottom electrode layer, for example. One key feature of the present invention is the composite seed layer 22 (individual layers not shown) disposed on the substrate 21. The composite seed layer 22 has a fcc(111) lattice and may be comprised of Ta/Ru/Cu in a Ta/M1/M2 configuration where a lower Ta layer having a thickness of 5 to 50 Angstroms contacts the substrate 21, a middle Ru (M1) layer about 5 to 100 Angstroms thick is formed on the Ta layer, and an upper Cu (M2) layer 1 to 100 Angstroms thick is formed on the Ru layer. In another aspect, the upper Cu layer may be removed and a Ta/Ru composite seed layer 22 is employed wherein the lower Ta layer has a thickness from 5 to 50 Angstroms and the upper Ru (M1) layer has a thickness from 20 to 100 Angstroms. Optionally, Ru may be replaced by another metal M1 layer having a fcc(111) or hcp(001) lattice structure to give a Ta/M1 configuration. For example, the seed layer 22 may have a Ta/Cu configuration where the Ta thickness is from 5 to 50 Angstroms and the Cu (M1) thickness is between 20 and 50 Angstroms. In another embodiment, the metal M1 may be comprised of Ti, Au, Zr, Hf or an alloy such as NiCr, TiCr, or NiFeCr with a thickness from 10 to 100 Angstroms. In particular, we have discovered that Ta/Ti, Ta/TiCr, and Ta/NiCr composite seed layers with a Ta/M1 configuration lead to high PMA spin valve structures with Hk>15000 Oe and Hc>2000 Oe.

In another embodiment, the upper Cu layer in the trilayer seed layer configuration may be replaced by a metal M2 such as Ti, Pd, W, Rh, Au, Ag, or the like with a thickness for M2 of from 1 to 100 Angstroms to give a Ta/M1/M2 configuration where M1 is unequal to M2. The M1 layer thickness in this case is preferably between 10 and 100 Angstroms. It is critical that the composite seed layer 22 be comprised of a lower Ta layer and at least one metal layer having fcc(111) or hcp(001) crystal orientation on the Ta layer to enhance the (111) crystal structure in other layers in the spin valve thereby enlarging the PMA magnitude in an overlying laminated layer comprised of (CoFe/Ni)$_x$ or the like as described in a later section.

In a preferred embodiment, the composite seed layer has a trilayer configuration represented by Ta/Ti/Cu or Ta/Cu/Ti wherein the Ta layer thickness is from 5 to 50 Angstroms, Ti layer thickness is 10 to 100 Angstroms, and Cu thickness is from 10 to 50 Angstroms. A composite seed layer comprised of the aforementioned three elements where Ta contacts the substrate and the Cu or Ti layer contacts an overlying PMA layer is especially useful for establishing high PMA multilayer structures having Hk>15000 Oe and Hc>2000 Oe. It should be noted that one of the Ta/Ti, Ta/TiCr, Ta/NiCr, Ta/Ti/Cu, and Ta/Cu/Ti embodiments described herein may also be employed as a hard bias structure for sensor stabilization. In one aspect, a Ta/Cu/Ti (or Ta/Ti) composite seed layer is preferred since the exposed top layer (Ti) is more corrosion resistant than a composite seed layer with an uppermost Cu layer. In a Ta/Ti/Cu composite seed layer, the Ti thickness is preferably increased rather than increasing Cu thickness to boost the PMA in an overlying magnetic layer such as a laminated (CoFe/Ni)$_x$ layer.

Above the composite seed layer 22 is a reference layer 23 that has a (Co$_{(100-Z)}$Fe$_Z$/Ni)$_x$ laminated structure where z is from 0 to 90 and x is between 5 and 30, and preferably, between 5 and 15 depending on the Mst requirement. Each of the plurality of CoFe layers in the laminated reference layer 23 has a thickness (t1) from 0.5 to 5 Angstroms, and preferably between 1.5 to 3 Angstroms. Each of the plurality of Ni layers in the laminated reference layer has a thickness (t2) from 2 to 10 Angstroms, and preferably between 3.5 and 8 Angstroms. Preferably, the thickness t2 of a Ni layer is greater than a CoFe layer thickness t1, and more preferably, t2~2×t1 in order to optimize the spin orbit interactions between adjacent CoFe and Ni layers. In addition, CoFe and Ni layers are deposited by a method that preserves the CoFe/Ni interfaces as described in a later section. In one aspect, when t1 is less than or equal to about 2 Angstroms, the CoFe layer may be considered as a "close-packed" layer and not necessarily having a (111) crystal orientation.

The present invention also encompasses an embodiment wherein the laminated reference layer is comprised of (CoFeR/Ni)$_x$ where R is a metal such as Ru, Rh, Pd, Ti, Zr, Hf, Ni, Cr, Mg, Mn, or Cu. Preferably, the R content in the CoFeR alloy is less than 10 atomic % and a CoFeR layer has a t1 thickness.

Above the laminated reference layer 23 is a first interfacial layer 24 that serves to promote uniform MgO growth in an overlying tunnel barrier layer 25 for higher spin polarization and a larger TMR (dR/R) ratio. In one aspect, the first interfacial layer is a ferromagnetic layer comprised of CoFeB with a thickness of 5 to 20 Angstroms. Alternatively, the first interfacial layer 24 may be a CoFeB/CoFe composite (not shown) with a lower CoFeB layer having a thickness from 5 to 20 Angstroms that contacts the laminated reference layer 23 and an upper CoFe layer having a thickness from 2 to 8 Angstroms that contacts the tunnel barrier layer 25. The upper CoFe layer may have the same Fe content as the Co$_{(100-Z)}$Fe$_Z$ layer in the laminated reference layer 23. Optionally, the first interfacial layer 24 may have a CoFe/CoFeB configuration.

The tunnel barrier layer 25 formed on the first interfacial layer 24 is preferably made of MgO although other tunnel barrier materials used in the art may be employed. As described in U.S. Patent Applications 2007/0111332 and 2007/0148786 to Headway, the MgO layer may be fabricated by depositing a first Mg layer on a reference layer or in this case on an interfacial layer contacting a reference layer, then performing a natural oxidation process, and finally depositing a second Mg layer on the oxidized first Mg layer. During a subsequent annealing process, the tunnel barrier layer 25 becomes essentially a uniform MgO layer. The tunnel barrier 25 is a non-magnetic layer.

A second interfacial layer 26 is formed on the tunnel barrier layer 25 to promote higher spin polarization in the MTJ and is a ferromagnetic layer made of CoFeB or a CoFe/CoFeB composite layer with a lower CoFe layer contacting the tunnel barrier and an upper CoFeB layer contacting the overlying free layer 27. The second interfacial layer may have the same thickness for the CoFeB and CoFe layers as in the first interfacial layer 24. When the second interfacial layer 26 includes a CoFe layer, the CoFe layer may have the same composition as the Co$_{(100-Z)}$Fe$_Z$ layers in the laminated reference layer 23 and free layer 27.

In one embodiment, the free layer 27 has a (Co$_{(100-Z)}$Fe$_Z$/Ni)$_Y$ laminated composition where z is from 0 to 90 atomic % and y is from 3 to 10, and preferably between 3 and 5. In one aspect, the value for z selected in the free layer is the same value for z as used in the laminated reference layer 23. However, the Co content in the free layer laminate may be different than the Co content in the reference layer laminate without losing any benefits provided by the MTJ structure of the present invention. Note that the laminated free layer 27 does not require a separate seed layer to establish PMA and may have a crystal structure other than the (111) orientation in the laminated reference layer. According to one embodiment, the laminated free layer 23 has a (100) crystal orientation with a high PMA. Optionally, the free layer laminate may have a CoFeR/Ni composition as described with regard to the laminated reference layer.

Note that in the exemplary embodiment, both of the reference layer 23 and free layer 27 are made of a laminated structure comprised of a plurality of (CoFe/Ni) stacks of layers, for example. However, the present invention also encompasses an embodiment wherein only one of the reference layer 23 and free layer 27 is employed. For example, reference layer 23 may be omitted and the interfacial layer 24 may serve as a reference layer although the thickness of the CoFeB or CoFeB/CoFe layer may be adjusted. In another aspect, the free layer 27 may be omitted and the second interfacial layer 26 may serve as the free layer. Accordingly, the thickness of the CoFeB or CoFe/CoFeB layer 26 may be adjusted to optimize the magnetic properties of the resulting MTJ stack.

The present invention also anticipates that one or both of the $[CoFe(t1)/Ni(t2)]_x$ or $[CoFe(t1)/Ni(t2)]_Y$ laminates may be replaced by a $[Co(t1)/NiFe(t2)]_x$ laminate and by a $[Co(t1)/NiFe(t2)]_Y$ laminate, respectively, as reference layer 23 and as free layer 27, where the Fe content in the NiFe layers is from 0 to 50 atomic %. In an alternative embodiment, the $[CoFe(t1)/Ni(t2)]_x$ and $[CoFe(t1)/Ni(t2)]_Y$ laminates may be replaced by $[Co(t1)/NiCo(t2)]_x$ and $[Co(t1)/NiCo(t2)]_Y$ laminates, respectively, in which the Co content in the NiCo layers is from 0 to 50 atomic %. In yet another embodiment, the laminated reference layer may have a composition represented by $[CoFe(t1)/NiFe(t2)]_x$ or $[CoFe(t1)/NiCo(t2)]_x$ and the laminated free layer may have a composition represented by $[CoFe(t1)/NiFe(t2)]_Y$ or $[CoFe(t1)/NiCo(t2)]_Y$.

According to another aspect of the present invention, the laminated free layer 27 may include an additional CoFe layer at the top of the laminated stack to give a $(CoFe/Ni)_Y/CoFe$, $(CoFeR/Ni)_Y/CoFe$, $(Co/NiFe)_Y/CoFe$, $(Co/NiCo)_Y/CoFe$, $(CoFe/NiFe)_Y/CoFe$, or $(CoFe/NiCo)_Y/CoFe$ configuration. The additional CoFe layer forms an interface between the uppermost Ni, NiFe, or NiCo layer in the laminated structure and the capping layer in order to prevent diffusion of Ni into the lower Ru layer in a Ru/Ta/Ru composite capping layer, for example.

The uppermost layer in the spin valve stack is a composite capping layer 28. In one aspect, the capping layer 28 has a Ru/Ta/Ru configuration where the upper Ru layer is used to provide oxidation resistance and excellent electrical contact to an overlying top electrode (not shown). A substantial reduction in critical current density (Jc) occurs in STT-MRAM applications when a thin Ru layer is employed as a capping layer due to the strong spin scattering effect of Ru. Critical current density (Jc) is preferably about $10^6$ A/cm² to be viable for spin-transfer magnetization switching in the 90 nm technology node and beyond. Higher values could destroy a thin tunnel barrier made of AlOx, MgO, or the like. The Ta layer may be included to offer etch resistance in subsequent processing steps. Optionally, other capping layer materials used in the art may be selected as capping layer 28.

Referring to FIG. 3, a second embodiment is depicted that shows a MTJ 30 which represents a modification of the first embodiment wherein an AFM layer 29 also known as a pinning layer is formed between the seed layer 22 and reference layer 23. In one aspect, the AFM layer 29 may be comprised of IrMn. However, other AFM materials used in the art such as MnPt, NiMn, OsMn, RuMn, RhMn, PdMn, RuRhMn, or MnPtPd may be selected for the pinning layer instead of IrMn. Besides pinning the magnetization direction of the reference layer 23, the AFM layer serves to act as a spin depolarization layer for reference layer stabilization. We have discovered that an AFM layer may be advantageously formed between the seed layer 22 and reference layer 23 without any degradation in PMA. The other layers in MTJ 30 are retained from the first embodiment. As mentioned previously, a $(CoFe/Ni)_x$ or $(CoFeR/Ni)_x$ laminated reference layer may be replaced by a $(Co/NiFe)_x$, $(Co/NiCo)_x$, $(CoFe/NiFe)_x$, or $(CoFe/NiCo)_x$ laminated layer. Likewise, a $(CoFe/Ni)_Y$ or $(CoFeR/Ni)_Y$ laminated free layer may be replaced by a $(Co/NiFe)_Y$, $(Co/NiCo)_Y$, $(CoFe/NiFe)_Y$, or $(CoFe/NiCo)_Y$ laminated layer.

Figure 4:
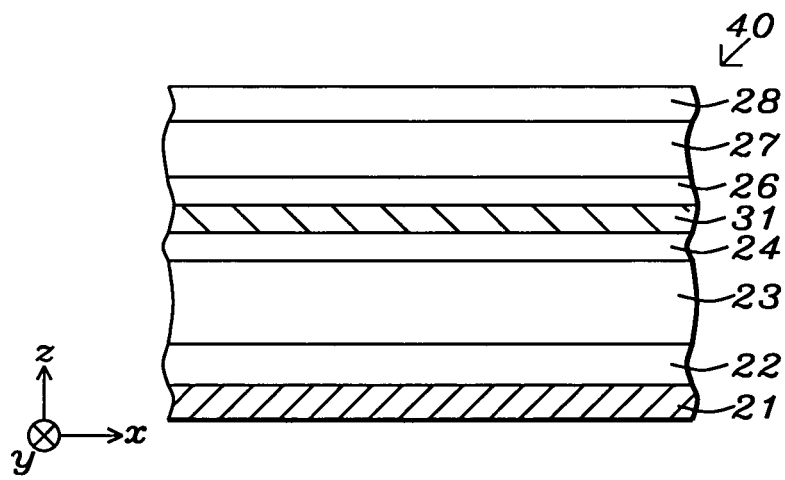
FIG. 4 is a cross-sectional view of a CPP-GMR bottom spin valve structure according to a third embodiment of the present invention.

Referring to FIG. 4, a third embodiment of the present invention is illustrated and relates to a bottom spin valve structure 40 with a CPP-GMR configuration which represents another modification of the first embodiment. In particular, the tunnel barrier layer 25 is replaced with a non-magnetic spacer layer 31 such as Cu. Moreover, the non-magnetic spacer may have a configuration in which upper and lower portions thereof are separated by a confining current path (CCP) layer. In the CCP embodiment, the current through the Cu spacer is limited by the means of segregating metal path and oxide formation. For example, thin Cu pathways in the CCP layer may be formed in an AlOx matrix as understood by those skilled in the art. With a CCP CPP-GMR scheme, the Cu metal path is limited through an insulator template or nano-oxide layer (NOL) so that the MR ratio can be significantly enhanced. The other MTJ layers 21-24, 26-28 are the same as described previously with respect to FIG. 2. The present invention also anticipates that the MTJ 40 may have a top spin valve or dual spin value structure (not shown) comprising one or both of a laminated reference layer made of $(CoFe/Ni)_x$ or the like and a laminated free layer made of $(CoFe/Ni)_Y$ or the like with an interfacial layer formed between each laminated layer and the non-magnetic spacer layer.

Figure 5:
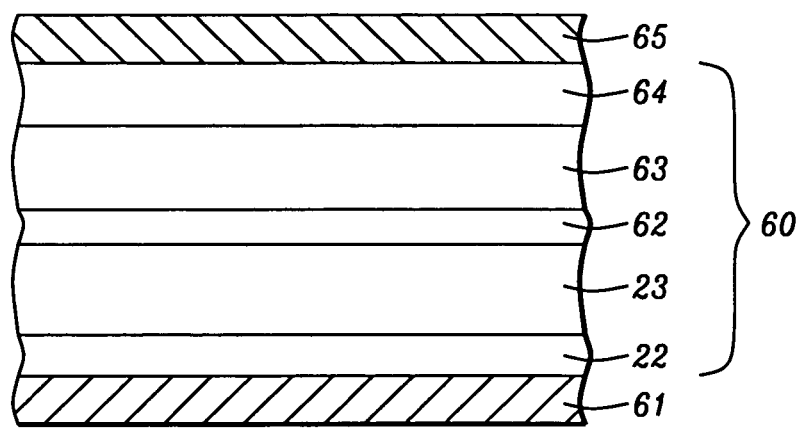
FIG. 5 is a cross-sectional view of an ac field generator structure of a MAMR design according to a fourth embodiment of the present invention.

Referring to FIG. 5, a fourth embodiment is depicted that relates to a MAMR structure 60. In the exemplary embodiment, a composite seed layer 22, laminated $(CoFe/Ni)_x$ reference layer 23, metal spacer 62, field generation layer 63, and a PMA layer 64 are sequentially formed on a first electrode 61 in a bottom spin transfer oscillator (STO) structure. A second electrode 65 contacts the top surface of the PMA layer 64. The laminated reference layer 23 serves as a spin injection layer for the MAMR device. The metal spacer 62 may be comprised of Cu or another metal or alloy with high conductivity as appreciated by those skilled in the art. Field generation layer 63 is a magnetic (ferromagnetic) layer such as FeCo or the like and functions as an oscillator layer having a magnetic moment that is capable of switching from one direction along an easy axis (not shown) to an opposite direction when sufficient spin torque is applied. PMA layer 64 is ferromagnetically coupled to field generation layer 63 and may be comprised of a laminated structure such as $(CoFe/Ni)_V$, $(CoFeR/Ni)_V$, $(Co/NiFe)_V$, $(Co/NiCo)_V$, $(CoFe/NiFe)_V$, or $(CoFe/NiCo)_V$ where v is an integer that may be from 5 to 20 in order to adjust Hc upward for the PMA layer. An important feature is that the composite seed layer 22 having a Ta/M1 or Ta/M1/M2 configuration enhances the (111) lattice structure and PMA in laminated reference layer 23. Moreover, laminated reference layer 23 is formed in a manner that preserves the CoFe/Ni interfaces or other laminated interfaces formed therein. Note that the present invention also includes a top STO structure which is similar to FIG. 5 except the positions of field generation layer 63 and reference layer 23 are switched. Furthermore, the (CoFe/Ni)$_x$ or (CoFeR/Ni)$_x$ laminate in reference layer 23 may be replaced by a (Co/NiFe)$_x$, (Co/NiCo)$_x$, (CoFe/NiFe)$_x$, or (CoFe/NiCo)$_x$ as in the first embodiment.

Figure 6:
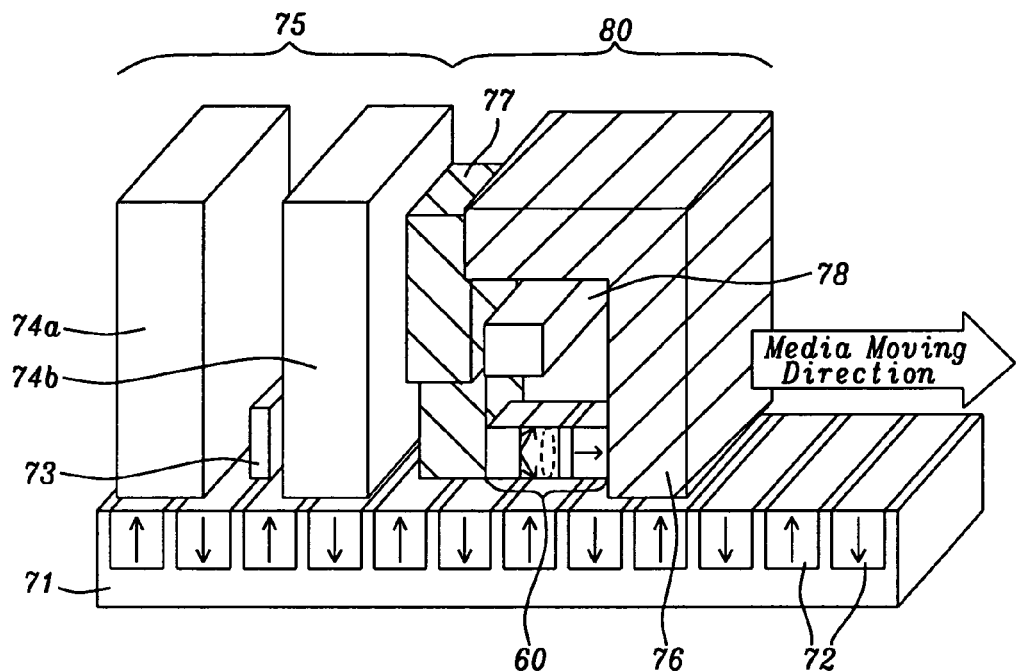
FIGS. 6 and 7 are cross-sections of spin transfer oscillator structures have a "top" and "bottom" STO configuration, respectively.

Referring to FIG. 6, the MAMR structure or spin transfer oscillator (STO) 60 may be formed in a write head 80. In the exemplary embodiment, the STO writer 80 is pictured as part of a merged read-write head where the read head 70 includes top and bottom shields 74a, 74b, and a sensor 73 between the aforementioned shields. STO writer 80 is comprised of a main pole 76, a trailing shield 77 and a wire 78 for injecting current into the spin transfer oscillator structure 60 which is shown in a "top" STO configuration. The "top" STO configuration has a laminated reference layer proximate to the main pole layer 76 and with a magnetization aligned in the same direction as the media moving direction. Note that the oscillator layer is formed closer to the first electrode (trailing shield 77) than the reference layer and has a magnetization direction which is free to rotate as indicated by the layer with two arrows and a dotted circle in imbedded structure 60.

Figure 7:
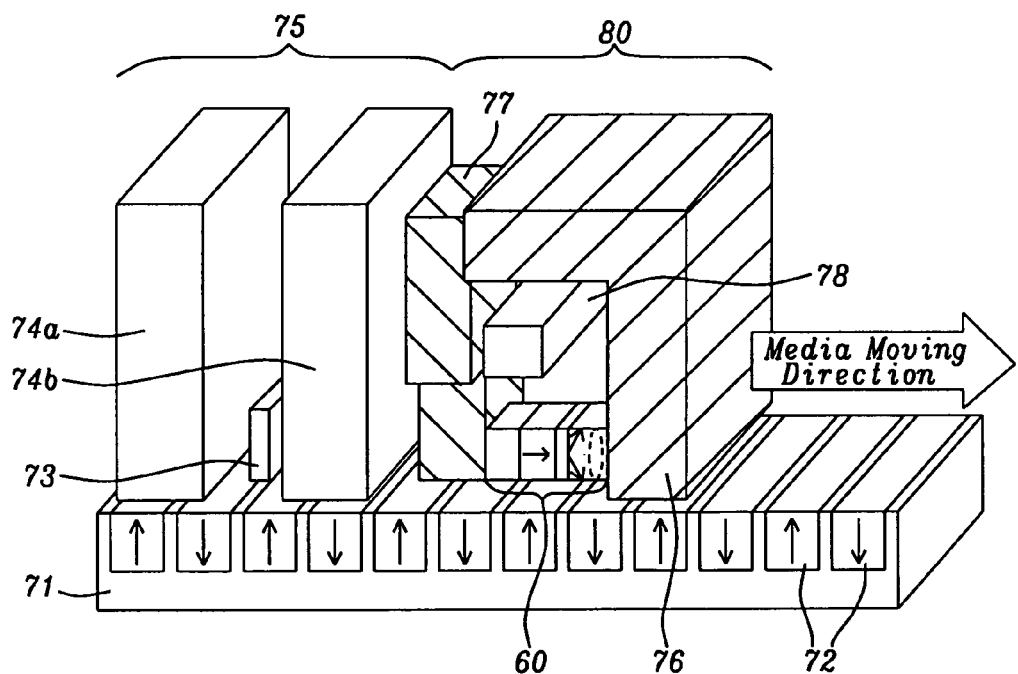

In an alternative embodiment as depicted in FIG. 7, the positions of the field generation (oscillator) layer and reference layer may be switched to give a "bottom" STO configuration. A top surface of STO structure 60 adjoins a side of the main pole 76 that faces the read head 75 while a bottom surface of STO structure 60 adjoins a side of the trailing shield opposite the read head. The merged read-write head moves in the direction indicated while suspended on an air bearing surface above substrate 71 having media tracks 72 formed thereon. In one aspect, trailing shield 77 replaces first electrode 61 and main pole 76 replaces the second electrode 62 in FIG. 5.

With regard to a process of forming the various spin valve structures of the aforementioned embodiments, all of the layers in the CPP spin valve stack may be laid down in a sputter deposition system. For instance, the CPP stack of layers may be formed in an Anelva C-7100 thin film sputtering system or the like which typically includes three physical vapor deposition (PVD) chambers each having 5 targets, an oxidation chamber, and a sputter etching chamber. At least one of the PVD chambers is capable of co-sputtering. Typically, the sputter deposition process involves an argon sputter gas with ultra-high vacuum and the targets are made of metal or alloys to be deposited on a substrate. All of the CPP layers may be formed after a single pump down of the sputter system to enhance throughput.

The present invention also encompasses an annealing step after all layers in the CPP spin valve structure have been deposited. The CPP spin valve structures 20, 30, 40, 60 may be annealed by applying a temperature between 220° C. and 400° C., and preferably from 250° C. to 360° C. for a period of 2 to 5 hours. No applied magnetic field is necessary during the annealing step because PMA is established due to the (111) texture in the composite seed layer 22 and due to the CoFe—Ni spin orbital interactions in the laminated reference layer 23 and laminated PMA layer 64.

An important feature of the present invention is the method for depositing the laminated reference layer 23 and laminated free layer 27 (and PMA layer 64). In particular, a lower RF power and high Ar pressure are utilized to avoid damaging the substrate on which each CoFe or Ni layer is deposited in order to preserve the resulting CoFe/Ni interfaces and enhance the PMA property therein. In other words, the ion energy impinging on recently deposited CoFe and Ni surfaces is minimized during sputter deposition of subsequent CoFe and Ni layers to reduce damage from ion bombardment during the sputtering process. In one embodiment, each of the CoFe and Ni layers in the laminated reference layer 23 and in the laminated free layer 27 is laid down in a DC magnetron sputter deposition chamber by a process comprising a RF power of less than 200 Watts, and an Ar flow rate of >15 standard cubic centimeters per minute (sccm). Deposition of each CoFe and Ni layer requires less than a minute and total time necessary to form a (CoFe/Ni)$_{20}$ structure is less than about an hour. It should be understood that the same deposition process disclosed herein is preferably employed for other laminated layers including (CoFeR/Ni)$_x$, (Co/NiFe)$_x$, (Co/NiCo)$_x$, (CoFe/NiFe)$_x$, and (CoFe/NiCo)$_x$ anticipated by the present invention.

Once all the layers in the spin valve structures 20, 30, 40, 60 are formed, the spin valve stack is patterned into an oval, circular, or other shapes from a top-down perspective along the z-axis by a well known photoresist patterning and reactive ion etch transfer sequence. Thereafter, an insulation layer (not shown) may be deposited on the substrate 21 (or 61) followed by a planarization step to make the insulation layer coplanar with the capping layer 28 (or PMA layer 64). Next, a top electrode such as second electrode 65 may be formed on the uppermost layer 64 (or 28) as appreciated by those skilled in the art.

EXAMPLE 1

Figure 12:
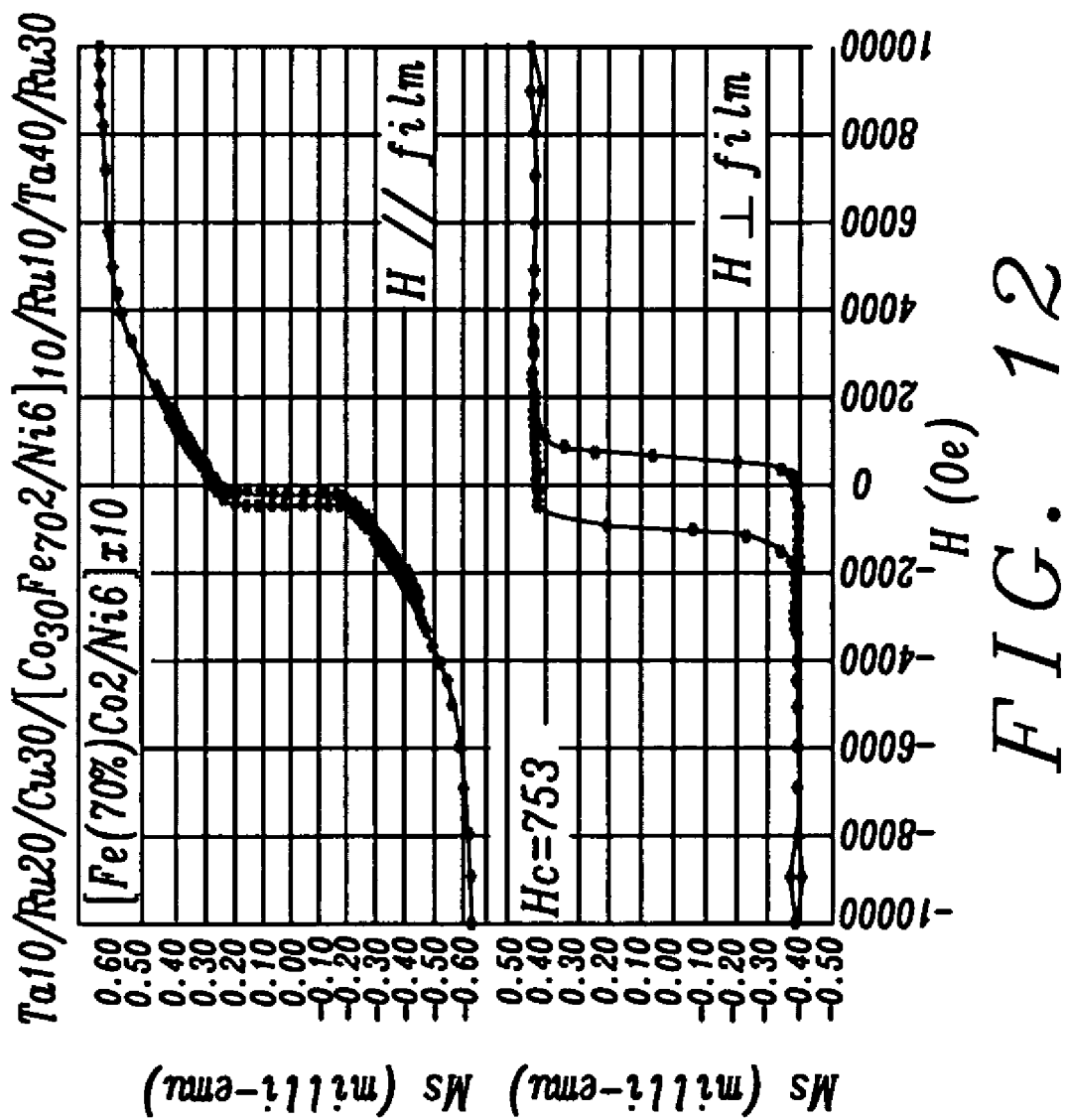
FIG. 12 shows MH curves for a $(Co_{30}Fe_{70}2/Ni6)_{10}$ laminated free layer or reference layer with PMA according to an embodiment of the present invention.

An experiment was performed to demonstrate the magnitude of perpendicular magnetic anisotropy in laminated layers formed according to an embodiment of the present invention. A partial spin valve stack comprised of a composite Ta10/Ru20/Cu30 seed layer, a (CoFe/Ni)$_x$ laminated layer where each CoFe layer is 2 Angstroms thick and each Ni layer is 6 Angstroms thick, and a Ru10/Ta40/Ru30 cap layer was fabricated in order to obtain PMA values from MH curves using a vibrating sample magnetometer (VSM). The thickness of each layer in the composite seed layer and in the composite cap layer is shown by the number following each of the elements. The results are illustrated in FIGS. 8-12 and indicate a substantial PMA can be achieved in several examples of (CoFe/Ni)$_x$ laminates involving a variety of CoFe alloys such as Co$_{90}$Fe$_{10}$ (FIG. 9), Co$_{75}$Fe$_{25}$ (FIG. 10), Co$_{50}$Fe$_{50}$ (FIG. 11), and Co$_{30}$Fe$_{70}$ (FIG. 12). The (Co/Ni)$_{20}$ example (FIG. 8) was previously reported in related patent application Ser. No. 12/456,621 and serves as a reference. The upper plot in each figure shows the horizontal to plane component of each magnetic field and the lower plot in each figure illustrates the perpendicular magnetic anisotropy (PMA) component. Furthermore, from torque measurements, we deduced that Hk for a (CoFe/Ni)$_{10}$ stack having a Ta10/Ru20/Cu30 seed layer is >15000 Oersted (Oe). It should be noted that high spin polarization and good thermal stability are achieved as well.

EXAMPLE 2

In a second experiment, a MTJ with a CPP-TMR configuration according to the first embodiment was fabricated to demonstrate the effectiveness of laminated (CoFe/Ni)$_x$ reference and free layers in providing high PMA. The resulting MTJ structure is represented by Ta10/Ru20/Cu30/(Co$_{(100-Z)}$Fe$_Z$2/Ni5)$_x$/CoFeB10/Co$_{(100-Z)}$Fe$_Z$2-8/MgO/Co$_{(100-Z)}$Fe$_Z$2-

8/CoFeB10/(Co$_{(100-Z)}$Fe$_Z$2/Ni5)$_y$/Ru10/Ta40/Ru30 where x, y, and z are values described previously and the number following each material is its thickness. The MTJ full film (unpatterned) stack of layers was found to have a TMR ratio, Hk, and other magnetic properties acceptable for use in high performance MRAM or STT-RAM structures. Hc is about 1000 Oe for this MTJ structure.

EXAMPLE 3

In another experiment, a MTJ full film stack with a CPP-TMR configuration was fabricated according to the second embodiment of the present invention. The resulting MTJ has a similar configuration to that in Example 2 except the upper Cu layer in the composite seed layer is replaced by an IrMn AFM layer and is represented by the following: Ta10/Ru20/IrMn70/(Co$_{(100-Z)}$Fe$_Z$2/Ni5)$_x$/CoFeB10/Co$_{(100-Z)}$Fe$_Z$2-8/MgO/Co$_{(100-Z)}$Fe$_Z$2-8/CoFeB10/(Co$_{(100-Z)}$Fe$_Z$2/Ni5)$_y$/Ru10/Ta40/Ru30. Again, Hk>15000 Oe and Hc is approximately 1000 Oe.

EXAMPLE 4

Figure 13:
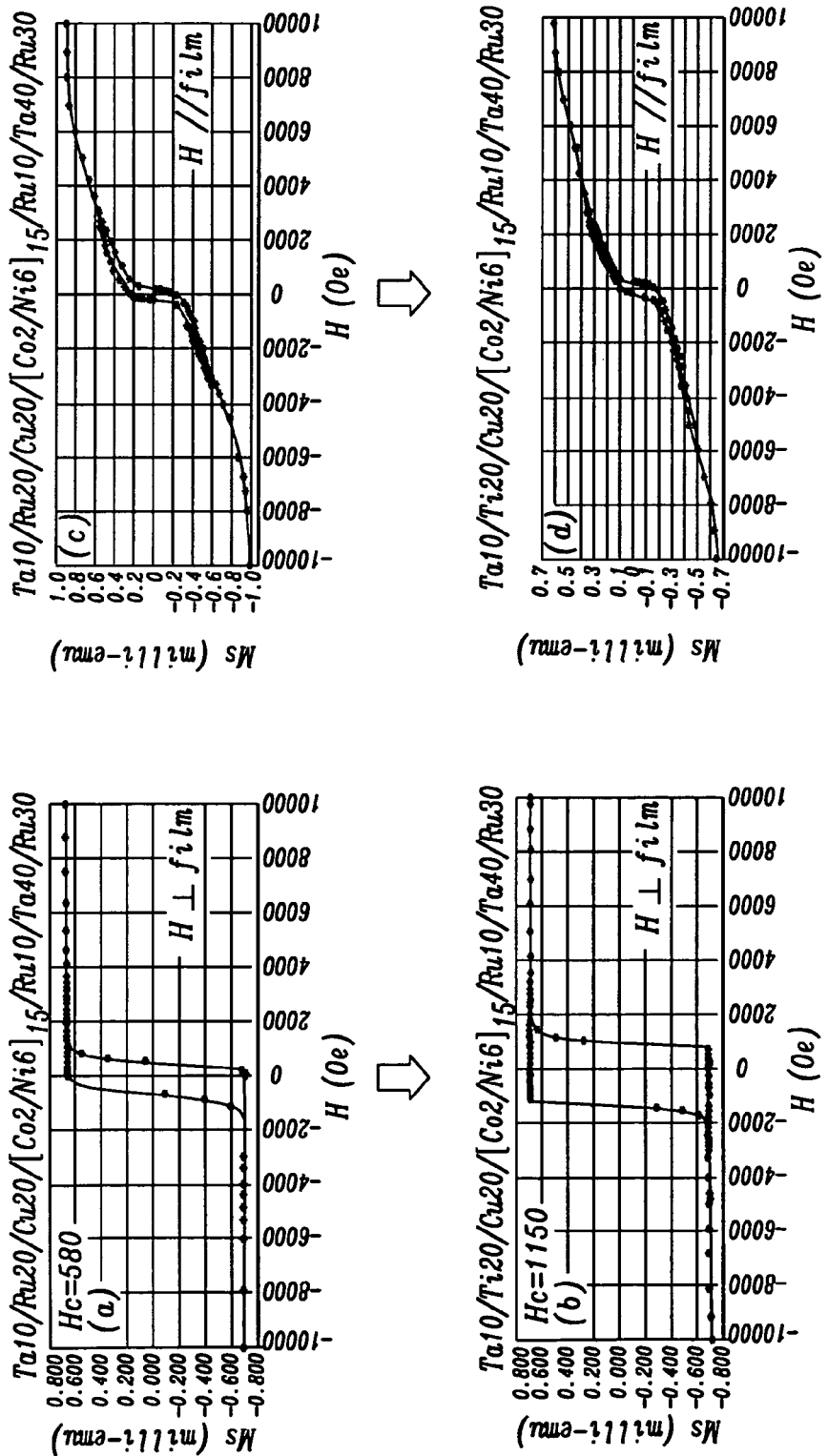
FIG. 13 shows MH curves for a partial spin valve stack comprised of different seed layers to demonstrate that replacing Ru with Ti in a Ta/Ru/Cu seed layer substantially increases Hc for the PMA component of the film.

With regard to FIG. 13, an experiment was performed to demonstrate how incorporating a Ta/Ti/Cu composite seed layer according to one embodiment of the present invention is able to establish a higher PMA in an overlying (CoFe/Ni)$_x$ laminated layer compared to a Ta/Ru/Cu seed layer. A partial spin valve stack comprised of a composite Ta10/Ru20/Cu20 seed layer, a (CoFe/Ni)$_x$ laminated layer where each CoFe layer is 2 Angstroms thick and each Ni layer is 6 Angstroms thick, and a Ru10/Ta40/Ru30 cap layer was fabricated in order to obtain PMA values from MH curves. The stack of layers was annealed at 220° C. for 2 hours. In plot 13a (upper left), the perpendicular magnetic anisotropy component is shown and has an Hc of 580 Oe. When the 20 Angstrom thick Ru layer is replaced in the composite seed layer by a 20 Angstrom thick Ti layer and the same annealing condition is applied, Hc increases to 1150 Oe as illustrated in FIG. 13c (lower left).

Figure 14:
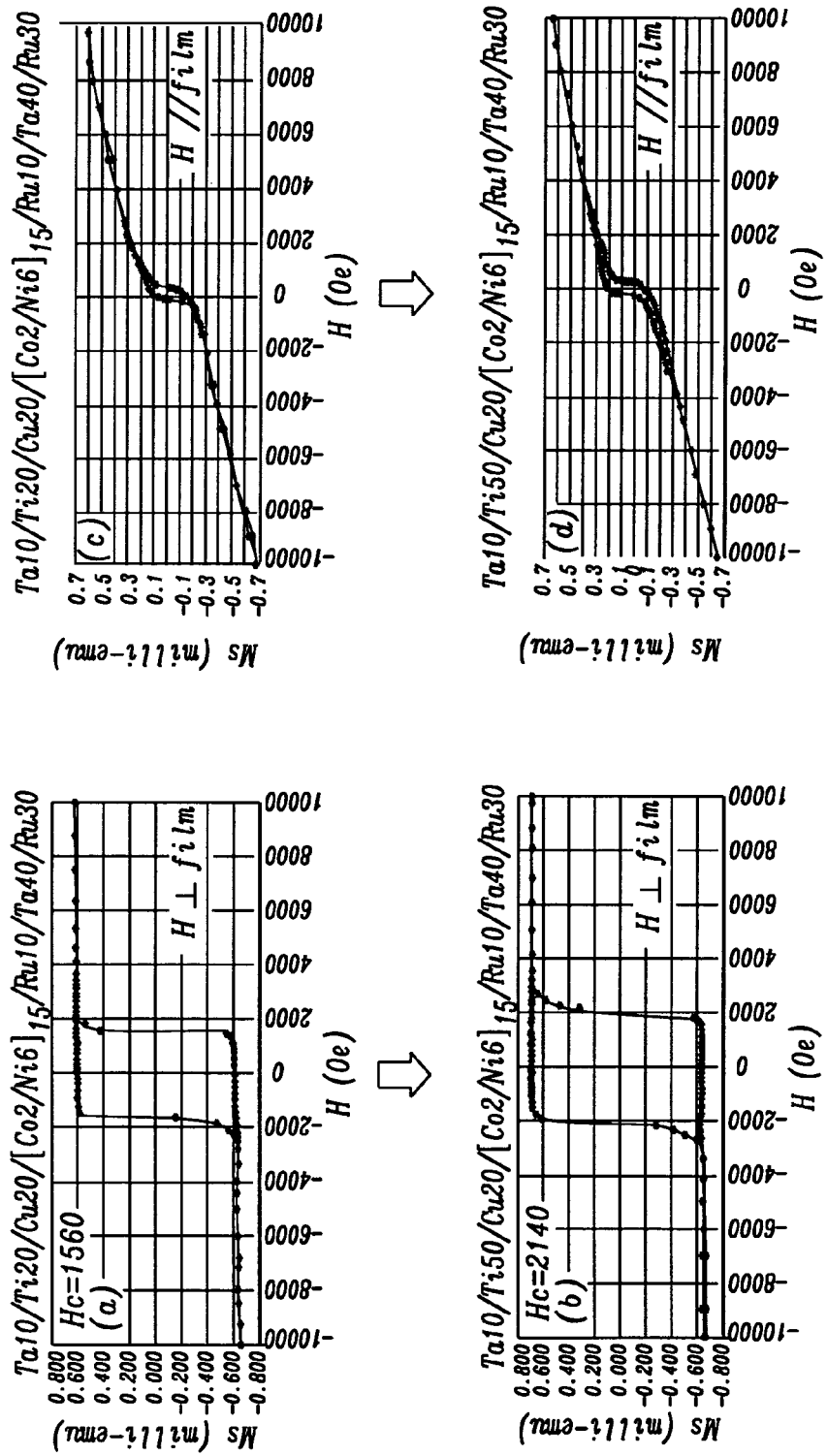
FIG. 14 shows MH curves for a partial spin valve stack that demonstrates increasing the annealing temperature or increasing the thickness of Ti in a Ta/Ti/Cu seed layer substantially increases Hc for the PMA component in the film.

Referring to FIG. 14a, Hc for the PMA component of the partial spin valve stack may be further increased to 1560 Oe by increasing the annealing temperature to 250° C. for 2 hours. An additional increase in Hc to 2140 Oe may be realized by increasing the Ti thickness to 50 Angstroms in the composite seed layer as shown in FIG. 14c. Thus, a Ta/Ti/Cu composite seed layer is very effective in increasing PMA in multilayer film stacks as described herein. It should be noted that high spin polarization and good thermal stability are achieved as well.

We have described various embodiments of spin valve structures having one or both of a laminated reference layer and laminated free layer comprised of (CoFe/Ni)$_x$ or the like that exhibit high perpendicular magnetic anisotropy which is fully established by a thin seed layer and by CoFe and Ni spin orbital interactions. It should be understood that in the alternative embodiments, Co—NiFe, CoFeR—Ni, Co—NiCo, CoFe—NiFe, and CoFe—NiCo spin orbital interactions also result in substantial PMA. The invention may be applied to various spintronic devices such as spin transfer oscillators for MRAM and for MAMR recording for head applications that are based on GMR spin valves or on TMR spin valves. A high PMA is achieved without the need for high temperature annealing or thick seed layers used in the prior art. However, PMA may be increased during an annealing process by raising the temperature slightly while maintaining mild conditions. Furthermore, PMA may be enhanced by employing a composite seed layer described herein and especially one made of Ta/Ti, Ta/Ti/Cu, Ta/Cu/Ti, Ta/TiCr, or Ta/NiCr.

While this invention has been particularly shown and described with reference to, the preferred embodiment thereof, it will be understood by those skilled in the art that various changes in form and details may be made without departing from the spirit and scope of this invention.

We claim:

1. A spin valve structure in a spintronic device, comprising:
   (a) a composite seed layer comprising at least a lower Ta layer formed on a substrate and a metal (M1) layer having a fcc(111) or hcp(001) crystal structure disposed on the lower Ta layer;
   (b) a free layer and a reference layer wherein one or both of said free layer and reference layer are comprised of a laminated structure with a plurality of (CoFe/Ni), (CoFeR/Ni), (Co/NiFe), (Co/NiCo), (CoFe/NiFe), or (CoFe/NiCo) stacks of layers in which a CoFe, CoFeR, or Co layer has a lesser thickness than a Ni, NiFe, or NiCo layer;
   (c) a non-magnetic layer formed between the reference layer and the free layer;
   (d) an interfacial layer formed between the non-magnetic layer and each of the laminated free layer and/or laminated reference layer; and
   (e) a cap layer.

2. The spin valve structure of claim 1 further comprised of an anti-ferromagnetic (AFM) layer formed between the composite seed layer and the reference layer.

3. The spin valve structure of claim 1 wherein a CoFe layer has a Co content from 0 to about 90 atomic %, a NiFe layer has a Fe content from 0 to about 50 atomic %, and a NiCo layer has a Co content from 0 to about 50 atomic %.

4. The spin valve structure of claim 1 wherein the non-magnetic layer is a tunnel barrier layer comprised of MgO in a CPP-TMR configuration and each interfacial layer is comprised of CoFeB or is a composite including a CoFeB layer and a CoFe layer.

5. The spin valve structure of claim 1 wherein the non-magnetic layer is a Cu spacer or a CCP layer formed between upper and lower portions of a Cu layer in a CPP-GMR configuration and each interfacial layer is comprised of CoFeB or is a composite including a CoFeB layer and a CoFe layer.

6. The spin valve structure of claim 1 wherein the composite seed layer has a Ta/M1 configuration in which the lower Ta layer has a thickness from about 5 to 50 Angstroms and the M1 layer is made of Ru with a thickness from about 20 to 100 Angstroms, Cu with a thickness from about 20 to 50 Angstroms, or is one of Au, Ti, TiCr, NiCr, NiFeCr, Zr, or Hf with a thickness between about 10 and 100 Angstroms.

7. The spin valve structure of claim 1 wherein the composite seed layer is further comprised of a metal layer M2 that is one of Cu, Ti, Pd, W. Rh, Au, or Ag and formed on the M1 layer to give a Ta/M1/M2 configuration in which the lower Ta layer thickness is from about 5 to 50 Angstroms, the M1 layer thickness is between about 10 and 100 Angstroms, the metal M2 layer thickness is from about 1 to 100 Angstroms, and M1 is unequal to M2.

8. The spin valve structure of claim 1 wherein the composite seed layer has a trilayer configuration represented by Ta/Ti/Cu or Ta/Cu/Ti wherein the Ta layer thickness is from about 5 to 50 Angstroms, Ti layer thickness is between about 10 and 100 Angstroms, and the Cu layer thickness is from about 10 to 50 Angstroms.

9. The spin valve structure of claim 1 wherein each of the Co, CoFe, or CoFeR layers in the one or both laminated free layer and laminated reference layer has a thickness from about 0.5 to 5 Angstroms and each of the Ni, NiFe, or NiCo layers has a thickness between about 2 and 10 Angstroms.

10. The spin valve structure of claim 1 wherein the free layer has a (CoFe/Ni)$_Y$ laminated structure wherein y is from about 3 to 10 and the reference layer has a (CoFe/Ni)$_x$ laminated structure wherein x is from about 5 to 30.

11. The spin valve structure of claim 10 further comprised of a CoFe layer formed between the (CoFe/Ni)$_Y$ laminated free layer and the cap layer.

12. The spin valve structure of claim 1 wherein R in the CoFeR layer is one of Ru, Rh, Pd, Ti, Zr, Hf, Ni, Cr, Mg, Mn, or Cu.

13. A spintronic device for MAMR recording, comprising:
a first electrode and a second electrode with a stack of layers formed between said first electrode and second electrode, including:
 (a) a composite seed layer comprising at least a lower Ta layer contacting the first electrode and a metal M1 layer having a fcc(111) or hcp(001) crystal orientation disposed on the lower Ta layer opposite the first electrode;
 (b) a first laminated layer having a (CoFe/Ni)$_x$, (CoFeR/Ni)$_x$, (Co/NiFe)$_x$, (Co/NiCo)$_x$, (CoFe/NiFe)$_x$, (CoFe/NiCo)$_x$ configuration having sufficient perpendicular magnetic anisotropy (PMA) to serve as a spin injection layer which is formed on the composite seed layer, and wherein x is from about 5 to 30 and wherein a first thickness of a Ni, NiFe, or NiCo layer is greater than a second thickness of a Co, CoFe, or CoFeR layer;
 (c) a metallic spacer formed between a field generation layer (oscillator layer) and the first laminated layer;
 (d) a magnetic layer that serves as an oscillator layer, and having a high spin polarization and a small magnetic damping coefficient formed on the metallic spacer; and
 (e) a PMA layer having a side that contacts the magnetic layer and an opposite side that contacts a second electrode.

14. The spintronic device of claim 13 wherein the composite seed layer has a lower Ta layer with a thickness from about 5 to 50 Angstroms and the metal M1 layer is comprised of Ru with a thickness from about 20 to 100 Angstroms, Cu with a thickness from about 20 to 50 Angstroms, or is one of Au, Ti, TiCr, NiCr, NiFeCr, Zr, or Hf with a thickness between about 10 and 100 Angstroms.

15. The spintronic device of claim 13 wherein the first electrode is a trailing shield in a write head and the second electrode is a main pole layer in said write head.

16. The spintronic device of claim 13 wherein the composite seed layer is further comprised of a metal M2 layer that is one of Cu, Ti, Pd, W. Rh, Au, or Ag and formed on the metal M1 layer to give a Ta/M1/M2 configuration in which the lower Ta layer thickness is about 5 to 50 Angstroms, the metal M1 layer thickness is between about 10 and 100 Angstroms, and metal M2 layer thickness is about 1 to 100 Angstroms.

17. The spintronic device of claim 13 wherein the composite seed layer has a trilayer configuration represented by Ta/Ti/Cu or Ta/Cu/Ti wherein the Ta layer thickness is from about 5 to 50 Angstroms, Ti layer thickness is between about 10 and 100 Angstroms, and the Cu layer thickness is from about 10 to 50 Angstroms.

18. The spintronic device of claim 13 wherein the second thickness is from about 0.5 to 5 Angstroms and the first thickness is between about 2 and 10 Angstroms.

19. The spintronic device of claim 13 wherein the PMA layer contacting the second electrode is a laminated layer with a (CoFe/Ni)$_v$, (CoFeR/Ni)$_v$, (Co/NiFe)$_v$, (Co/NiCo)$_v$, (CoFe/NiFe)$_v$, (CoFe/NiCo)$_v$ configuration where v is from about 5 to 20.

20. The spintronic device of claim 19 wherein R in the CoFeR layer is one of Ru, Rh, Pd, Ti, Zr, Hf, Ni, Cr, Mg, Mn, or Cu.

21. A method of forming a spin valve structure in a spintronic device; comprising:
 (a) depositing a composite seed layer having a fcc(111) crystalline lattice structure on a substrate, said composite seed layer comprises at least a lower Ta layer and a metal M1 layer having a fcc(111) or hcp(001) crystal orientation disposed on the lower Ta layer;
 (b) forming a stack of layers on said composite seed layer, said stack of layers comprises:
  (1) a (CoFe/Ni)$_x$, (CoFeR/Ni)$_x$, (Co/NiFe)$_x$, (Co/NiCo)$_x$, (CoFe/NiFe)$_x$, or (CoFe/NiCo)$_x$ laminated reference layer where x is from about 5 to 30 and wherein a Ni, NiFe, or NiCo layer has a first thickness greater than a second thickness of a Co, CoFe, or CoFeR layer;
  (2) a tunnel barrier layer formed between the laminated reference layer and a laminated free layer;
  (3) a first interfacial layer formed between the laminated reference layer and the tunnel barrier layer;
  (4) a second interfacial layer formed between the tunnel barrier layer and the laminated free layer; and
  (5) a laminated free layer having a (CoFe/Ni)$_Y$, (CoFeR/Ni)$_Y$, (Co/NiFe)$_Y$, (Co/NiCo)$_Y$, (CoFe/NiFe)$_Y$, or (CoFe/NiCo)$_Y$ configuration where y is from about 3 to 10 and wherein a Ni, NiFe, or NiCo layer has a greater thickness than a Co, CoFe, or CoFeR layer.

22. The method of claim 21 further comprised of annealing the spin valve structure at a temperature of about 220° C. to 400° C. for a period of about 2 to 5 hours.

23. The method of claim 21 wherein the laminated reference layer and laminated free layer are deposited by a DC magnetron sputtering process comprising a RF power of less than about 200 Watts and an Ar flow rate of greater than about 15 standard cubic centimeters per minute.

24. The method of claim 21 wherein the composite seed layer has a lower Ta layer thickness from about 5 to 50 Angstroms and the metal M1 layer is comprised of Ru with a thickness from about 20 to 100 Angstroms, Cu with a thickness from about 20 to 50 Angstroms, or is one of Au, Ti, NiCr, NiFeCr, Zr or Hf with a thickness between about 10 and 100 Angstroms.

25. The method of claim 21 wherein the composite seed layer is further comprised of a metal M2 layer that is one of Cu, Ti, Pd, W. Rh, Au, or Ag and formed on the metal M1 layer to give a Ta/M1/M2 configuration in which the lower Ta layer thickness is from about 5 to 50 Angstroms, the metal M1 layer thickness is between about 10 and 100 Angstroms, and the metal M2 layer thickness is from about 1 to 100 Angstroms.

26. The method of claim 21 wherein the composite seed layer has a trilayer configuration represented by Ta/Ti/Cu or Ta/Cu/Ti wherein the Ta layer thickness is from about 5 to 50 Angstroms, Ti layer thickness is between about 10 and 100 Angstroms, and the Cu layer thickness is from about 10 to 50 Angstroms.

27. The method of claim 21 wherein a CoFe layer has a Co content from 0 to about 90 atomic% and a NiFe or NiCo layer has a Ni content from 0 to about 50atomic %.

28. The method of claim 21 wherein the second thickness is from about 0.5 to 5 Angstroms and the first thickness is between about 2 and 10 Angstroms.

29. The method of claim 21 wherein R in the CoFeR layer is one of Ru, Rh, Pd, Ti, Zr, Hf, Ni, Cr, Mg, Mn, or Cu.

* * * * *